United States Patent
Chang et al.

(10) Patent No.: US 9,378,780 B1
(45) Date of Patent: Jun. 28, 2016

(54) SENSE AMPLIFIER

(71) Applicant: National Tsing Hua University, Hsinchu (TW)

(72) Inventors: Meng-Fan Chang, Taichung (TW); Jui-Yu Hung, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/740,290

(22) Filed: Jun. 16, 2015

(51) Int. Cl.
*G11C 7/00* (2006.01)
*G11C 7/06* (2006.01)
*G11C 7/12* (2006.01)

(52) U.S. Cl.
CPC . *G11C 7/062* (2013.01); *G11C 7/12* (2013.01)

(58) Field of Classification Search
USPC ................................ 365/205, 206, 207, 210.1
See application file for complete search history.

(56) References Cited

U.S. PATENT DOCUMENTS

| | | | |
|---|---|---|---|
| 4,733,373 A * | 3/1988 | Murotani ........... | G11C 11/4094 365/203 |
| 5,804,992 A * | 9/1998 | Lee ..................... | G11C 7/12 327/51 |
| 7,050,346 B2 * | 5/2006 | Maejima ............ | G11C 16/0483 365/185.17 |
| 7,443,750 B2 | 10/2008 | Forbes | |
| 7,868,663 B2 | 1/2011 | Oh et al. | |

FOREIGN PATENT DOCUMENTS

| | | |
|---|---|---|
| CN | 87103121 | 11/1987 |
| CN | 1685438 | 10/2005 |
| TW | 200426836 | 12/2004 |

* cited by examiner

*Primary Examiner* — Vu Le
(74) *Attorney, Agent, or Firm* — Jianq Chyun IP Office

(57) ABSTRACT

The present disclosure provides a sense amplifier. The sense amplifier includes a first inverting circuit, a second inverting circuit, a pre-charge circuit, a voltage adjusting circuit, and a discharge circuit. The first inverting circuit has a first input end and a first output end, and the second inverting circuit has a second input end and a second output end. The pre-charge circuit pulls up the voltage levels on the first and second output ends according to a power voltage during a pre-charge time period. The voltage adjusting circuit respectively receives a bit line voltage and a reference voltage during the pre-charge time period, and adjusts voltages on the first and second output ends respectively according to the voltage on the second and first receiving ends. The discharge circuit pulls down voltage levels on the first and second receiving ends of the voltage adjusting circuit during a discharge time period.

10 Claims, 3 Drawing Sheets

SENSE AMPLIFIER

BACKGROUND OF THE INVENTION

1. Field of Invention

The present invention generally relates to a sense amplifier, and more particularly to a small-offset voltage-mode sense amplifier.

2. Description of Prior Art

In recently years, a memory with lower operation power, high operation speed, and high storage density is needed for using in mobile devices, medical electrical equipment, and portable storage devices, etc.

By using a power source with low voltage level, a larger read margin is necessary for against process, voltage and temperature (PVT) variation. In conventional art, a data read scheme of a sense amplifier is suffered from slow margin developing. Such as that, a longer read access time is needed for the sense amplifier.

Referring to FIG. 1A and FIG. 1B, FIGS. 1A and 1B illustrate waveform diagrams of bit line voltages for a memory cell during a data reading operation with standard power voltage and a low power voltage, respectively. Voltages on bit lines BL1 and BL2 are compared for sensing out data stored in a memory cell, wherein the bit line BL1 is corresponding to stored data "1", and the bit line BL2 is corresponding to stored data "0". In FIG. 1A, at a time point T1, a voltage difference dV1 is large enough for sensing out the stored in the memory cell, and the data reading operation can be completed at the time point T1. On the other hand, in FIG. 1B, a voltage difference dV2 is large enough for sensing out the stored in the memory cell till a time point T2, and the data reading operation can be completed with a longer time period when the memory is operated in a lower power voltage.

SUMMARY OF THE INVENTION

The present disclosure provides a sense amplifier for improving performance of reading operation on a memory cell.

The present disclosure provides a sense amplifier. The sense amplifier includes a first inverting circuit, a second inverting circuit, a pre-charge circuit, a voltage adjusting circuit, and a discharge circuit. The first inverting circuit has a first input end and a first output end, and the second inverting circuit has a second input end and a second output end, wherein the first input end is coupled to the second output end, and the second input end is coupled to the first output end. The pre-charge circuit is coupled to the first and second output ends, wherein the pre-charge circuit pulls up the voltage levels on the first and second ends according to a power voltage during a pre-charge time period. The voltage adjusting circuit is coupled to the first and second output ends, respectively receives a bit line voltage and a reference voltage during the pre-charge time period by a first receiving end and a second receiving end, and adjusts voltages on the first and second output ends respectively according to the voltage on the second and first receiving ends. The discharge circuit is coupled to the control ends of the first and second transistors, wherein the discharge circuit pulls down voltage levels on the first and second receiving ends of the voltage adjusting circuit during a discharge time period. The first and second inverting circuits are enabled for a sensing operation after the discharge time period, and the pre-charge time period is before the discharge time period.

According to an embodiment of present disclosure, the sense amplifier further includes an initial circuit. The initial circuit is coupled to the first and second output ends, and the initial circuit pulls down voltage levels on the first and second output ends to a reference ground during an initial time period, wherein the initial time period is before the pre-charge time period.

According to an embodiment of present disclosure, the voltage adjusting circuit includes a first transistor, a second transistor, a first capacitor, and a second capacitor. The first transistor has a control end coupled to the first receiving end, and a first end coupled to the first output end. The second transistor has a control end coupled to the second receiving end, and a first end coupled to the second output end.

The first capacitor is coupled between a second end of the first transistor and the second receiving end. The second capacitor is coupled between a second end of the second transistor and the first receiving end.

According to an embodiment of present disclosure, the voltage adjusting circuit further includes a first switch and a second switch. The first switch has a first end receiving the reference voltage, and a second end coupled to the first receiving end, and the first switch is controlled by a read enable signal. The second switch has a first end receiving the bit line voltage, and a second end coupled to the second receiving end, and the second switch is controlled by the read enable signal.

According to an embodiment of present disclosure, the first and second transistors are N-type transistors.

According to an embodiment of present disclosure, the pre-charge circuit includes a first transistor and a second transistor. The first transistor has a first end receiving a power voltage, a second end coupled to a first output end, and a control end for receiving a pre-charge enable signal. The second transistor has a first end receiving the power voltage, a second end coupled to a second output end, and a control end for receiving the pre-charge enable signal.

According to an embodiment of present disclosure, the discharge circuit includes a first transistor, and a second transistor. The first transistor has a first end coupled to the first receiving end, a second end coupled to a reference ground, and a control end for receiving a discharge enable signal. The second transistor has a first end coupled to the second receiving end, a second end coupled to the reference ground, and a control end for receiving the discharge enable signal.

According to an embodiment of present disclosure, the first inverting circuit includes a first transistor and a second transistor. The second inverting circuit includes a third transistor and a fourth transistor. The first transistor has a first end receiving a power voltage, a second end coupled to the first output end, and a control end coupled to the first input end. The second transistor has a first end coupled to the first output end, a second end coupled to a reference ground, and a control end coupled to the first input end. The third transistor has a first end receiving the power voltage, a second end coupled to the second output end, and a control end coupled to the second input end. The fourth transistor has a first end coupled to the second output end, a second end coupled to the reference ground, and a control end coupled to the second input end.

According to an embodiment of present disclosure, the sense amplifier further includes a first switch, and a second switch. The first switch has a first end receiving the power voltage, and a second end coupled to the first ends of the first and third transistors. The second switch has a first end coupled to the second ends of the second and fourth transistors, and a second end coupled to the reference ground. Wherein the first and second switches are merely turned on during the sense time period.

According to an embodiment of present disclosure, wherein the first and second switches are two transistor switches.

Accordingly, the sense amplifier provides the discharge circuit for pulling down voltage levels on the first and second receiving ends of the voltage adjusting circuit during a discharge time period, and a voltage difference between the bit line voltage and the reference voltage can be enlarged during the discharge time period. Such as that, the data stored in the memory cell can be sensed out more quickly. Even in the memory with low power voltage, the performance of the memory can be promoted by using the sensing amplifier of present disclosure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
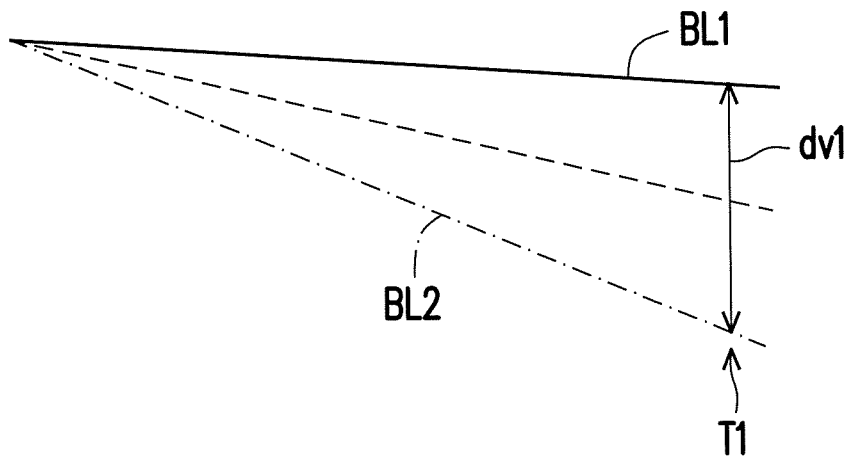
FIGS. 1A and 1B illustrate waveform diagrams of bit line voltages for a memory cell during a data reading operation with standard power voltage and a low power voltage, respectively.
Figure 1B:
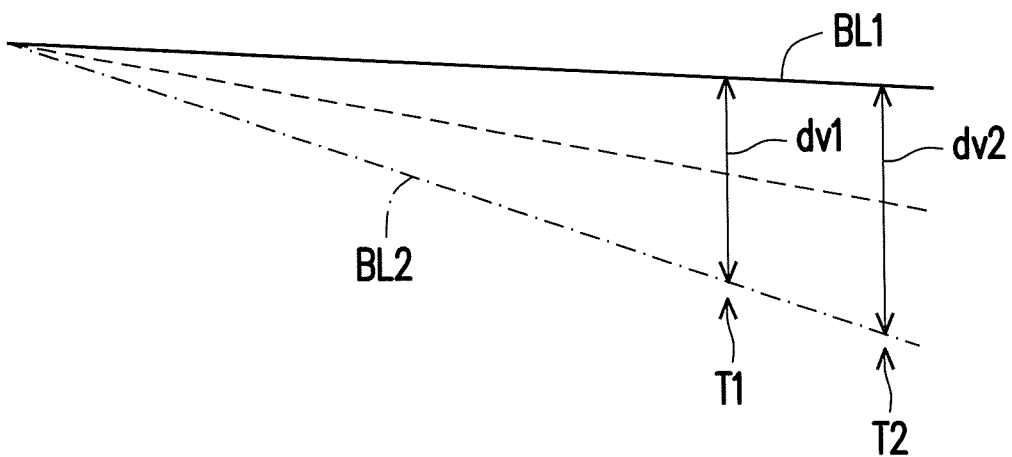

Reference will now be made in detail to the present preferred embodiment of the invention, examples of which are illustrated in the accompanying drawings.

Wherever possible, the same reference numbers are used in the drawings and the description to refer to the same or like parts.

Figure 2:
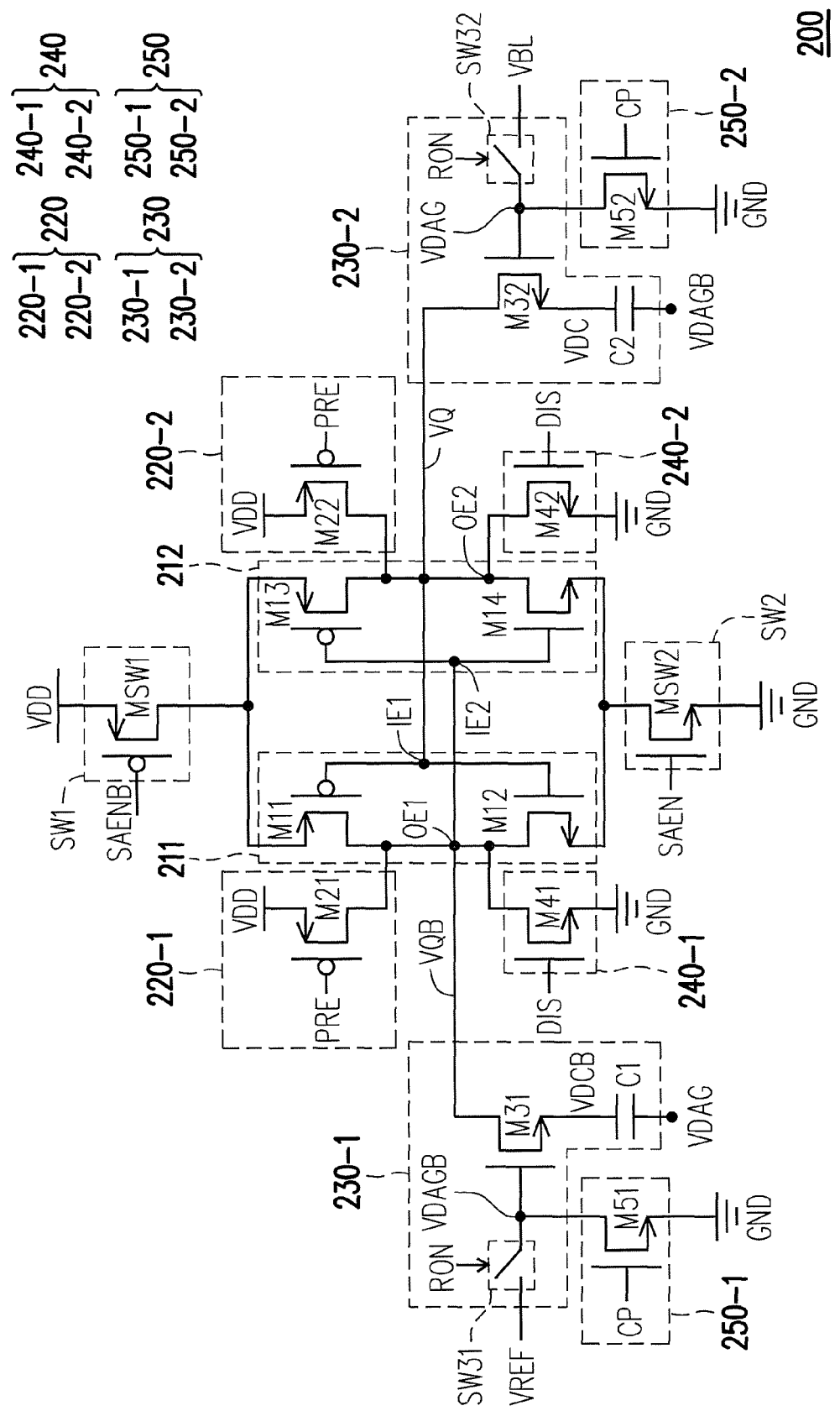
FIG. 2 is a circuit diagram of a sense amplifier according to an embodiment of the present disclosure.

Referring to FIG. 2, FIG. 2 is a circuit diagram of a sense amplifier according to an embodiment of the present disclosure. The sense amplifier 200 includes a first inverting circuit 211, a second inverting circuit 212, pre-charge circuit 220, a voltage adjusting circuit 230, a discharge circuit 250, an initial circuit 240 and switches SW1 and SW2. The first inverting circuit 211 has a first input end IE1 and a first output end OE1, and the second inverting circuit 212 has a second input end 1E2 and a second output end OE2. Wherein, the first input end IE1 is coupled to the second output end OE2, and the first output end OE1 is coupled to the second input end 1E2.

The first inverting circuit 211 includes transistors M11 and M12. A first end of the transistor M11 receives a power voltage VDD through the switch SW1, a second end of the transistor M11 is coupled to the first output end OE1 of the first inverting circuit 211, and a control end of the transistor M11 is coupled to the first input end IE1 of the first inverting circuit 211. A first end of the transistor M12 is coupled to the first output end OE1 of the first inverting circuit 211, a second end of the transistor M12 is coupled to a reference ground GND through the switch SW2, and a control end of the transistor M12 is coupled to the first input end IE1 of the first inverting circuit 211. The second inverting circuit 212 includes transistors M13 and M14. A first end of the transistor M13 receives a power voltage VDD through the switch SW1, a second end of the transistor M13 is coupled to the second output end OE2 of the second inverting circuit 212, and a control end of the transistor M13 is coupled to the second input end 1E2 of the second inverting circuit 212. A first end of the transistor M14 is coupled to the second output end OE2 of the second inverting circuit 212, a second end of the transistor M14 is coupled to a reference ground GND through the switch SW2, and a control end of the transistor M14 is coupled to the second input end 1E2 of the second inverting circuit 212.

The switches SW1 and SW2 are controlled by a sense enable signal SAEN and an inverted sense enable signal SAENB, and are used to enable or disable the first and second inverting circuits 211 and 212. In detail, when the switches SW1 and SW2 are turned on respectively according to the inverted sense enable signal SAENB and the sense enable signal SAEN, the first and second inverting circuits 211 and 212 are enable for a data sensing operation. On the contrary, when the switches SW1 and SW2 are cut off respectively according to the inverted sense enable signal SAENB and the sense enable signal SAEN, the first and second inverting circuits 211 and 212 are disabled and the data sensing operation is stopped.

In this embodiment, the switches SW1 and SW2 are respectively formed by transistors MSW1 and MSW2. A first and second ends of the transistor MSW1 are respectively coupled to the power voltage VDD and the first ends of the transistors M11 and M13, and a control end of the transistor MSW1 receives the inverted sense enable signal SAENB. A first and second ends of the transistor MSW2 are respectively coupled to the second ends of the transistors M12 and M14 and the reference ground GND, and a control end of the transistor MSW2 receives the sense enable signal SAEN. Wherein, the sense enable signal SAEN is inverted to the inverted sense enable signal SAENB.

The pre-charge circuit 220 includes a first pre-charge circuit 220-1 and a second pre-charge circuit 220-2. The first pre-charge circuit 220-1 and the second pre-charge circuit 220-2 respectively coupled to the first and second output ends OE1 and OE2, and the first pre-charge circuit 220-1 and the second pre-charge circuit 220-2 respectively pull up the voltage levels on the first and second ends OE1 and OE2 to the power voltage VDD during a pre-charge time period. The first pre-charge circuit 220-1 and the second pre-charge circuit 220-2 respectively include transistors M21 and M22. A first end of the transistor M21 receive the power voltage VDD, the second end of the transistor M21 is coupled to the first output end OE1, and a control end of the transistor M21 receives the pre-charge enable signal PRE. A first end of the transistor M22 receive the power voltage VDD, the second end of the transistor M22 is coupled to the second output end OE2, and a control end of the transistor M22 receives the pre-charge enable signal PRE.

Both of the transistors M21 and M22 are turned on according to the pre-charge enable signal PRE during the pre-charge time period, and voltage levels of the first and second output end OE1 and OE2 may be pulled up toward to the power voltage VDD during the pre-charge time period.

The voltage adjusting circuit 230 includes a first voltage adjusting circuit 230-1 and a second voltage adjusting circuit 230-2. The first voltage adjusting circuit 230-1 includes a switch SW31, a transistor M31, and a capacitor C1. A first end of the switch SW31 receives a reference voltage VREF, and a control end of the switch SW31 receives read enable signal RON. A first end of the transistor M31 is coupled to the first output end OE1, a control end of the transistor M31 is coupled to a second end of the switch SW31, and a second end of the transistor M31 is coupled to a first end of the capacitor C1. The second end of the switch SW31 is a first receiving end for receiving the reference voltage VREF when the switch SW31 is turned on. Further, a second end of the capacitor C1 is coupled to a control end of a transistor M32 disposed in the second voltage adjusting circuit 230-2.

The second voltage adjusting circuit 230-2 further includes a switch SW32 and a capacitor C2. A first end of the switch SW32 receives a bit-line voltage VBL from a selected memory cell, and a control end of the switch SW32 receives read enable signal RON. The second end of the switch SW32 is a second receiving end for receiving the bit-line voltage VBL when the switch SW32 is turned on. A first end of the transistor M32 is coupled to the second output end OE2, a control end of the transistor M32 is further coupled to a second end of the switch SW32, and a second end of the transistor M32 is coupled to a first end of the capacitor C2. Further, a second end of the capacitor C2 is coupled to the control end of a transistor M31 disposed in the first voltage adjusting circuit 230-1.

By the first and second voltage adjusting circuits 230-1 and 230-2, the voltage level on the first output end OE1 may be adjusted by a voltage applied on the second end of the capacitor C1, and the voltage level on the second output end OE2 may be adjusted by a voltage applied on the second end of the capacitor C2.

In this embodiment, the switches SW31 and SW32 are turned on during the pre-charge time period according to the read enable signal RON. That is, during the pre-charge time period, the reference voltage VREF and the bit-line voltage VBL are respectively transported to the first and second receiving ends through the switches SW31 and SW32, respectively.

The discharge circuit 250 includes a first discharge circuit 250-1 and a second discharge circuit 250-2. The first discharge circuit 250-1 is coupled between the first receiving end and the reference ground GND, and controlled by a discharge enable signal CP. The second discharge circuit 250-2 is coupled between the second receiving end and the reference ground GND, and controlled by the discharge enable signal CP.

The first and second discharge circuits 250-1 and 250-2 respectively include transistors M51 and M52. A first end of the transistor M51 is coupled to the first receiving end, a second end of the transistor M51 is coupled to the reference ground, and a control end of the transistor M51 receives the discharge enable signal CP. A first end of the transistor M52 is coupled to the second receiving end, a second end of the transistor M52 is coupled to the reference ground, and a control end of the transistor M52 receives the discharge enable signal CP.

During the discharge time period, the transistors M51 and M52 are turned on according to the discharge enable signal CP, and the voltage levels of the first and second receiving ends are pulled down to the reference ground by the transistors M51 and M52. Then, a voltage drop on the first receiving end may be induced to a voltage drop on the second output end OE2 through the second voltage adjusting circuit 230-2, and a voltage drop on the second receiving end may be induced to a voltage drop on the first output end OE1 through the first voltage adjusting circuit 230-1.

The initial circuit 240 includes a first initial circuit 240-1 and a second initial circuit 240-2. The first initial circuit 240-1 is coupled to the first output end OE1, and the second initial circuit 240-2 is coupled to the second output end OE2. The first and second initial circuits 240-1 and 240-2 respectively include transistors M41 and M42. First and second ends of the transistor M41 are respectively coupled to the first output end OE1 and the reference ground GND, first and second ends of the transistor M42 are respectively coupled to the second output end OE2 and the reference ground GND, and the control ends of the transistors M41 and M42 receive an initial enable signal DIS. During an initial time period, the transistors M41 and M42 are turned on according to the initial enable signal DIS, and the voltage levels of the first and second output end OE1 and OE2 are pulled down to equal to the reference ground GND.

Figure 3:
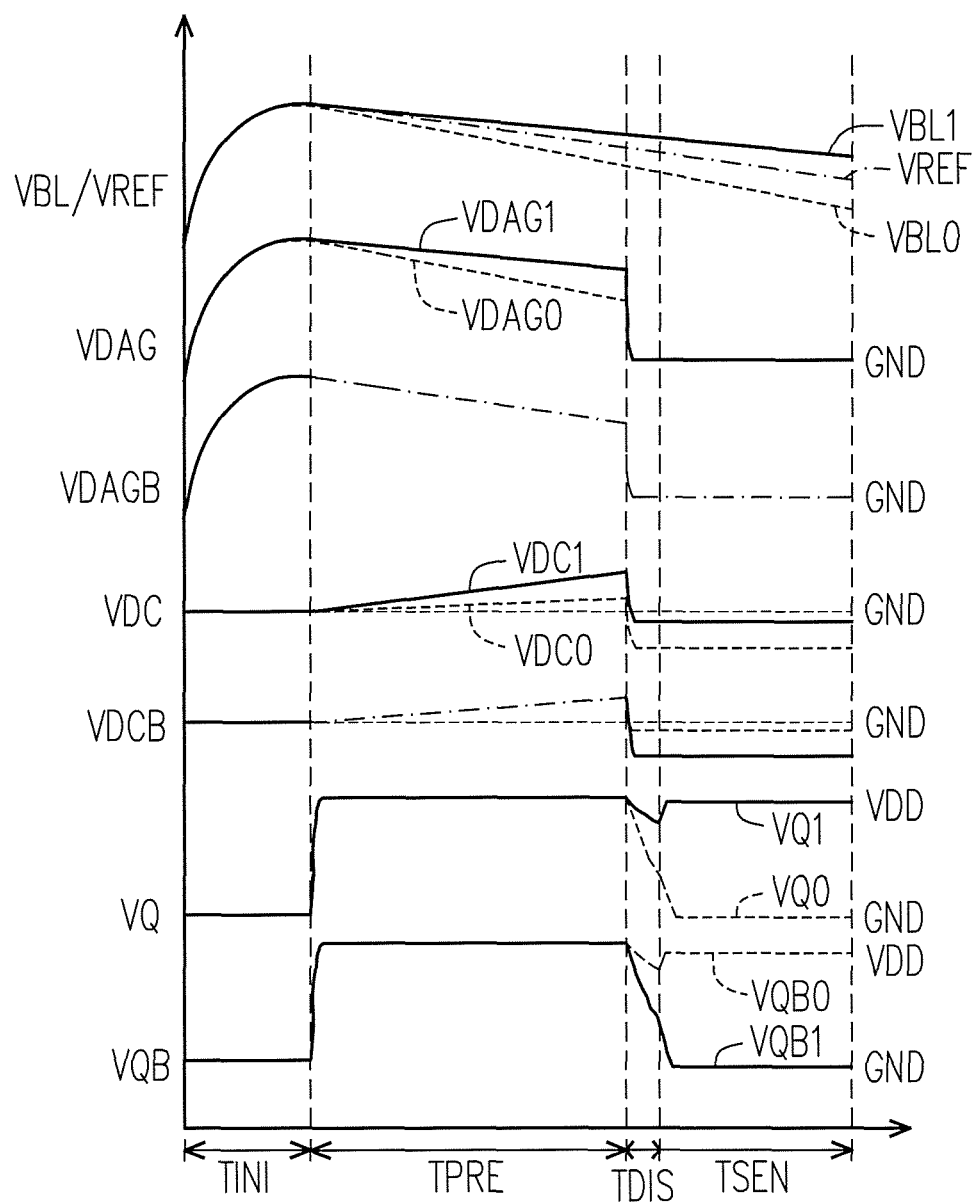
FIG. 3 illustrates a waveform plot of the sense amplifier 200.

About the detail action of the operation of the sense amplifier 200, referring to FIG. 2, and FIG. 3, wherein FIG. 3 illustrates a waveform plot of the sense amplifier 200.

During the initial time period TINT, the switches SW1 and SW2 are turned off, and the first and second inverting circuits 211 and 212 are disabled. Moreover, the transistors M41 and M42 are turned on according to the initial enable signal DIS, and the voltages VQB and VQ of the first and second output ends OE1 and OE2 are pulled to equal to the reference ground GND (ex. 0V). The switches SW31 and SW32 are turned on according to the read enable signal RON, and the first and second voltage adjusting circuits 230-1 and 230-2 respectively receive the reference voltage VREF and the bit-line voltage VBL. Besides, the transistors M21 and M22 are cut off according to the pre-charge enable signal PRE during the initial time period TINT. Additional, the transistors M51 and M52 are cut off during the initial time period TINT.

During the initial time period TINT, since the reference voltage VREF and the bit line voltage VBL gradually rise to a high voltage level simultaneously, voltages VDAGB and VDAG may gradually rise to a high voltage level simultaneously accordingly. On the other hand, voltages VQB and VQ are held on equal to the reference ground GND, and voltages VDCB and VDC may also be held on equal to the reference ground GND. That is, during the initial time period TINT, both of the voltage drops of the capacitors C1 and C2 are reset to zero.

During the pre-charge time period TPRE, the transistors M41 and M42 are cut off, and the paths for pulling down the voltages VQB and VQ on the first and second output ends OE1 and OE2 are cut off. Further, the transistors M21 and M22 are turned on, and the voltages VQB and VQ on the first and second output ends OE1 and OE2 are pulled up toward to the power voltage VDD. During the same time period, the reference voltage VREF and the bit line voltage VBL are gradually reduced. If the bit line voltage VBL corresponding to a stored data "0", the bit line voltage VBL is smaller than the reference voltage VREF (ex. The bit line voltage VBL0), and if the bit line voltage VBL corresponding to a stored data "1", the bit line voltage VBL is larger than the reference voltage VREF (ex. The bit line voltage VBL1).

On the other hand, during the pre-charge time period TPRE, after the time point which the transistors M21 and M22 are turned on, the voltages VDC and VDCB are respectively gradually pulled up toward to VBL-VTH2 and VREF-VTH1, wherein VTH2 is a threshold voltage of the transistor M32 and VTH1 is a threshold voltage of the transistor M31. The increasing of the voltages VDC and VDCB are respectively corresponding to the reducing of the bit line voltage VBL and the reference voltage VREF. At an end time point of the pre-charge time period TPRE, the voltage VDC may be equal to VBL-VTH2, and the voltage VDCB may be equal to VREF-VTH1. Such as that, the voltage VDC may be the voltage VDC0 which is corresponding to the bit line voltage VBL0, and the voltage VDC may be the voltage VDC1 which is corresponding to the bit line voltage VBL1.

Similar to the voltages VDCB and VDC, the voltages VDAGB and VDAG are gradually reduced according to the reducing of the bit line voltage VBL and the reference voltage VREF. If the bit line voltage VBL is corresponding to the stored data "1", the voltage VDAG may be varied such as voltage VDAG1, and if the bit line voltage VBL is corresponding to the stored data "0", the voltage VDAG may be varied such as voltage VDAG0.

Please be noted here, the voltage VDAG1 is held on larger than the voltage VDAGB during the pre-charge time period TPRE after the voltages VDAG and VDAGB are reduced, and the voltage VDAG0 is held on smaller than the voltage VDAGB during the pre-charge time period TPRE after the voltages VDAG and VDAGB are reduced.

During the discharge time period TDIS, the transistors M51 and M52 are turned on, and the voltages VDAGB and VDAG are pulled down to the reference ground GND suddenly. Additional, during the discharge time period TDIS, the transistors MSW1, MSW2, M21, M22, M41 and M42 are cut off, and the switches SW31, SW32 are all cut off at this time too.

Accordingly, during the discharge time period TDIS, the voltages VQB and VQ are respectively pulled down through the capacitors C1 and C2 based on the voltage drops on the voltages VDAGB and VDAG. If the bit line voltage VBL of the selected memory cell is corresponding to the stored data "1", since the voltage VDAG1 is larger than the voltage VDAGB at the end time point of the pre-charge time period TPRE, a pulled down amount of the voltage VQB is larger than a pulled down amount of the voltage VQ (ex. VQ1 and VQB1). That is, the voltage difference between the voltages VQ and VQB can be enlarged, and the stored data can be sensed easily and quickly during the sense time period TSEN. On the contrary, If the bit line voltage VBL of the selected memory cell is corresponding to the stored data "0", since the voltage VDAG0 is smaller than the voltage VDAGB at the end time point of the pre-charge time period TPRE, a pulled down amount of the voltage VQB is smaller than a pulled down amount of the voltage VQ (ex. VQ0 and VQB0). That is, the voltage difference between the voltages VQ and VQB can also be enlarged, and the stored data can be sensed easily and quickly during the sense time period TSEN.

It should be noted here, since the transistors M31 and M32 are operated on a saturation region. The currents of transistor M31 and M32 can be respectively presented by the formulas (1) and (2) shown as below:

$$Id1 = \tfrac{1}{2}\mu_n Cox*W/L*(VGS1-VTH1)^2 \qquad (1)$$

$$Id2 = \tfrac{1}{2}\mu_n Cox*W/L*(VGS2-VTH2)^2 \qquad (1)$$

Wherein, $\mu_n$ is carrier mobility, Cox is a capacitance of a gate oxide of the transistors M31 and M32, W/L is a ratio of channel width and length of the transistors M31 and M32, VGS1 is a voltage drop of gate and source of the transistor M31, VTH1 is a threshold voltage of the transistor M31, VGS2 the a voltage drop of gate and source of the transistor M32, and VTH2 is a threshold voltage of the transistor M32.

The VGS1−VTH1 of the formula (1) can be presented by VBL−VREF+VTH1−VTH1=BL−VREF, and the VGS2−VTH2 of the formula (2) can be presented by VREF−VBL+VTH2−VTH2=VREF−BL. That is, the terms VTH1 and VTH2 are eliminated, and the device mismatch effect between the transistor M31 and M32 can be ignored in the sense amplifier 200. Furthermore, a voltage differences of the voltages VQ and VQB is effected by a discharged effect caused by the transistors M31 and M32. From the formula "VBL−VREF−(VREF−VBL)=2*(VBL−VREF)", a doubled sense margin of the sense amplifier 200 can be obtained.

Additional, at a beginning time point of the discharge time period TDIS, the voltages VDC and VDCQ are pulled down to smaller than the reference ground GND.

During the sense time period TSEN, the switches SW31 and SW32 are cut off, and the switches MSW1 and MSW2 are turned on. Further, the transistors M21, M22, M41, M42, M51 and M52 are all turned off. The first and second inverting circuits 211 and 212 receive the power voltage VDD through the switch MSW1 and coupled to the reference ground GND through the switch MSW2, and the first and second inverting circuits 211 and 212 are enabled to sense the data stored in the selected memory cell according to the voltages VQ and VQB. Since the difference of the voltages VQ and VQB is enlarged, the data stored in the selected memory cell can be quickly sensed, and the performance can be promoted.

In summary, in present disclosure, the discharge circuit and the voltage adjusting circuit are provided, and the voltage difference between the two input ends of the first and second inverting circuit can be enlarged efficiency. Such as that, the voltage difference for data sensing can be enlarged, and the data sensing operation can be completely quickly. Further, in some embodiment of present disclosure, the device mismatch in the sense amplifier can be reduced, and the performance of the sense amplifier can be promoted.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A sense amplifier, comprising:
a first inverting circuit, having a first input end and a first output end;
a second inverting circuit, having a second input end and a second output end, wherein the first input end is coupled to the second output end, and the second input end is coupled to the first output end;
a pre-charge circuit, coupled to the first and second output ends, wherein the pre-charge circuit pulls up voltage levels on the first and second output ends according to a power voltage during a pre-charge time period;
a voltage adjusting circuit, coupled to the first and second output ends, respectively receiving a bit line voltage and a reference voltage during the pre-charge time period by a first receiving end and a second receiving end, and adjusting voltages on the first and second output ends respectively according to the voltage on the second and first receiving ends; and
a discharge circuit, coupled to the first and second receiving ends, wherein the discharge circuit pulls down voltage levels on the first and second receiving ends of the voltage adjusting circuit during a discharge time period,
wherein, the first and second inverting circuits are enabled for a sensing operation after the discharge time period, and the pre-charge time period is before the discharge time period.

2. The sense amplifier according to claim 1, further comprising:
an initial circuit, coupled to the first and second output ends, wherein the initial circuit pulls down voltage levels on the first and second ends to a reference ground during an initial time period, wherein the initial time period is before the pre-charge time period.

3. The sense amplifier according to claim 1, wherein the voltage adjusting circuit comprises:
  a first transistor, having a control end coupled to the first receiving end, a first end coupled to the first output end;
  a second transistor, having a control end coupled to the second receiving end, a first end coupled to the second output end;
  a first capacitor, coupled between a second end of the first transistor and the second receiving end; and
  a second capacitor, coupled between a second end of the second transistor and the first receiving end.

4. The sense amplifier according to claim 3, wherein the voltage adjusting circuit further comprises:
  a first switch, having a first end receiving the reference voltage, and a second end coupled to the first receiving end, and being controlled by a read enable signal; and
  a second switch, having a first end receiving the bit line voltage, and a second end coupled to the second receiving end, and being controlled by the read enable signal.

5. The sense amplifier according to claim 3, wherein the first and second transistors are N-type transistors.

6. The sense amplifier according to claim 1, wherein the pre-charge circuit comprises:
  a first transistor, having a first end receiving a power voltage, a second end coupled to a first output end, and a control end for receiving a pre-charge enable signal; and
  a second transistor, having a first end receiving the power voltage, a second end coupled to a second output end, and a control end for receiving the pre-charge enable signal.

7. The sense amplifier according to claim 1, wherein the discharge circuit comprises:
  a first transistor, having a first end coupled to the first receiving end, a second end coupled to a reference ground, and a control end for receiving a discharge enable signal; and
  a second transistor, having a first end coupled to the second receiving end, a second end coupled to the reference ground, and a control end for receiving the discharge enable signal.

8. The sense amplifier according to claim 1, wherein the first inverting circuit comprises:
  a first transistor, having a first end receiving a power voltage, a second end coupled to the first output end, and a control end coupled to the first input end; and
  a second transistor, having a first end coupled to the first output end, a second end coupled to a reference ground, and a control end coupled to the first input end,
  the second inverting circuit comprises:
  a third transistor, having a first end receiving the power voltage, a second end coupled to the second output end, and a control end coupled to the second input end; and
  a fourth transistor, having a first end coupled to the second output end, a second end coupled to the reference ground, and a control end coupled to the second input end.

9. The sense amplifier according to claim 8, further comprising:
  a first switch, having a first end receiving the power voltage, a second end coupled to the first ends of the first and third transistors, and a control end coupled to a sense enable signal; and
  a second switch, having a first end coupled to the second ends of the second and fourth transistors, a second end coupled to the reference ground, and a control end coupled to the sense enable signal,
  wherein the first and second switches are merely turned on according to the sense enable signal during the sense time period.

10. The sense amplifier according to claim 9, wherein the first and second switches are respectively formed by a P-type transistor and a N-type transistor.

* * * * *